United States Patent
Chen et al.

(10) Patent No.: US 8,704,205 B2
(45) Date of Patent: Apr. 22, 2014

(54) SEMICONDUCTOR STRUCTURE WITH IMPROVED CAPACITANCE OF BIT LINE

(75) Inventors: Shih-Hung Chen, Jhudong Township, HsinChu County (TW); Hang-Ting Lue, Hsinchu (TW); Kuang-Yeu Hsieh, Hsinchu (TW); Erh-Kun Lai, Taichung (TW); Yen-Hao Shih, New Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 76 days.

(21) Appl. No.: 13/594,353

(22) Filed: Aug. 24, 2012

(65) Prior Publication Data

US 2014/0054535 A1    Feb. 27, 2014

(51) Int. Cl.
*H01L 47/00* (2006.01)

(52) U.S. Cl.
USPC .......... 257/4; 257/28; 257/208; 257/E29.309; 438/127; 438/287

(58) Field of Classification Search
CPC .............. H01L 277/0688; H01L 27/11578; H01L 21/8221; H01L 21/823487
USPC ................ 257/28, 208, 324, 326, E29.309, 257/E21.614; 438/128, 287
See application file for complete search history.

(56) References Cited

U.S. PATENT DOCUMENTS

2012/0181580 A1    7/2012    Lue et al.

FOREIGN PATENT DOCUMENTS

| TW | 100148426 | 12/2001 |
|---|---|---|
| TW | 201232554 | 8/2012 |
| TW | 201232701 | 8/2012 |

OTHER PUBLICATIONS

English language translation of abstract of TW 100148426 (pp. 1-2 of publication).
English language translation of abstract of TW 201232554 (published Aug. 1, 2012).
English language translation of abstract of TW 201232701 (published Aug. 1, 2012).

*Primary Examiner* — Mark A Laurenzi
(74) *Attorney, Agent, or Firm* — McClure, Qualey & Rodack, LLP

(57) ABSTRACT

A semiconductor structure with improved capacitance of bit lines includes a substrate, a stacked memory structure, a plurality of bit lines, a first stair contact structure, a first group of transistor structures and a first conductive line. The first stair contact structure is formed on the substrate and includes conductive planes and insulating planes stacked alternately. The conductive planes are separated from each other by the insulating planes for connecting the bit lines to the stacked memory structure by stairs. The first group of transistor structures is formed in a first bulk area where the bit lines pass through and then connect to the conductive planes. The first group of transistor structures has a first gate around the first bulk area. The first conductive line is connected to the first gate to control the voltage applied to the first gate.

15 Claims, 10 Drawing Sheets

SEMICONDUCTOR STRUCTURE WITH IMPROVED CAPACITANCE OF BIT LINE

BACKGROUND

1. Technical Field

The invention relates in general to a semiconductor structure, and more particularly to a semiconductor structure with improved capacitance of bit lines.

2. Description of the Related Art

With the development of semiconductor technology, the demand for the memory device focuses on small size and larger memory capacity. For satisfying the requirement, a memory device having a high element density is need. Since the critical dimension of the memory device has been decreased to the ultimate in the art, designers develop a structure for improving the density of memory, using 3D stack memory device so as to increase the memory capacity and lower the size per cell. However, in the 3D stack structure, the bit lines connected to different stack blocks make the capacitance of each stack blocks in parallel, and the capacitances of the stack blocks summed up results in an increase of the capacitance of the bit lines, causing a delay for transmitting the bit signals.

SUMMARY

The invention is directed to a semiconductor structure with improved capacitance of bit lines. In an embodiment, an independent control circuit is disposed into the 3D stack memory so that the capacitance of each stack block is independent or some capacitances of the stack blocks are connected in parallel. Thus, a signal delay due to high capacitance of bit lines is avoided.

According to one embodiment, a semiconductor structure with improved capacitance of bit lines is provided. The semiconductor structure includes a substrate, a stacked memory structure, a plurality of bit lines, a first stair contact structure, a first group of transistor structures and a first conductive line. The bit lines cross over the stacked memory structure formed on the substrate. The first stair contact structure is formed on the substrate and includes conductive planes and insulating planes stacked alternately. The conductive planes are separated from each other by the insulating planes for connecting the bit lines to the stacked memory structure by stairs. The first group of transistor structures is formed in a first bulk area where the bit lines pass through and then connect to the conductive planes. The first group of transistor structures has a first gate around the first bulk area. The first conductive line is connected to the first gate to control the voltage applied to the first gate.

According to another embodiment, a semiconductor structure with improved capacitance of bit lines is provided. The semiconductor structure includes a substrate, a stacked memory structure, a plurality of first local bit lines and main bit lines, a first stair contact structure, a first group of transistor structures and a first conductive line. The first local bit lines and main bit liens cross over the stacked memory structures formed on the substrate. The first stair contact structure is formed on the substrate and includes conductive planes and insulating planes stacked alternately. The conductive planes are separated from each other by the insulating planes for connecting the local bit lines to the stacked memory structures by stairs. The first group of transistor structures is formed in a first bulk area where the main bit lines pass through and then connect to the conductive planes. The first group of transistor structures has a first gate around the first bulk area. The first conductive line is connected to the first gate to control the voltage applied to the first gate.

The above and other aspects of the invention will become better understood with regard to the following detailed description of the preferred but non-limiting embodiments. The following description is made with reference to the accompanying drawings.

DETAILED DESCRIPTION

According to the semiconductor structure with improved capacitance of bit lines in the present embodiments, an independent control circuit, for example including a number of transistor structures aligned along a horizontal direction or an array of transistor structures aligned along a horizontal and a vertical directions, is disposed into a 3D stacked memory structure. One group of transistor structures can be selected to open so that the bit lines with different orders couple to some portions of the stacked memory structures via the opened transistors, while another group of transistor structures is selected to close so that the bit lines with different orders disconnect from other portions of the stacked memory structures via the closed transistors. Therefore, the capacitance of the bit line is the sum of that of stacked memory structures selected to open. Accordingly, the problem of a signal delay due to high capacitance of bit lines is avoided by using the semiconductor structure of the present invention.

A number of embodiments are disclosed below for detailed descriptions of the invention only, not for limiting the scope of protection of the invention.

First Embodiment

Figure 1:
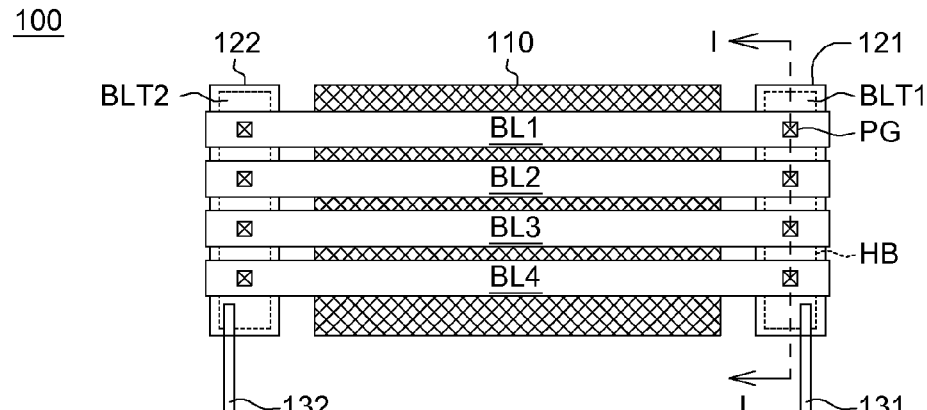
FIG. 1 shows a top schematic view of a semiconductor structure with improved capacitance of bit lines according to an embodiment of the invention.

Referring to FIG. 1, a top schematic view of a semiconductor structure 100 with improved capacitance of bit lines according to an embodiment of the invention is shown. Taken four bit lines BL1-BL4 arranged in order for example, a stacked memory structure 110 is located between a first stair contact structure 121 and a second stair contact structure 122.

The stacked memory structure 110, for example 3D NAND flash memory, has multi-layers of memory planes arranged from bottom to top in order. A first bit line BL1 is connected to a first layer of memory plane via the first stair contact structure 121, and a second bit line BL2 is connected to a second layer of memory plane via the first stair contact structure 121, and so on. Similarly, various bit lines BL1-BL4 can be connected to different memory planes via the second stair contact structure 122. In an embodiment, the first stair contact structure 121 and the second stair contact structure 122 are connected to the first conductive strips (in odd rows) and the second conductive strips (in even rows) arranged alternately but on the same memory plane. The first conductive strips and the second conductive strips constitute a set of finger conductive strips interlaced to each other.

More details of description related to the stacked memory structure 110, the stair contact structures 121, 122 and the conductive strips are disclosed in the pending U.S. application Ser. No. 13/008,410, filed on Jan. 18, 2011, entitled "Semiconductor Structure and Manufacturing Method of the Same" and the pending U.S. application series No. 61/434, 350, filed on Jan. 19, 2011, entitled "Three Dimensional Memory Array Adjacent to Trench Sidewalls and Manufacturing Method thereof". The references are incorporated therein.

In the present embodiment, a first group of transistor structures BLT1, a second group of transistor structures BLT2, and a first conductive line 131 and a second conductive line 132 connected to the gates of the transistor structures are formed on the top of the first stair contact structure 121 and the second stair contact structure 122, respectively. The conductive line inputs a voltage and selects one of first and second transistor structures BLT1 and BLT2 to be opened or closed. Thus, the capacitances of bit lines BL1-BL4 are controlled by the voltage applied to the gate.

Figure 2:
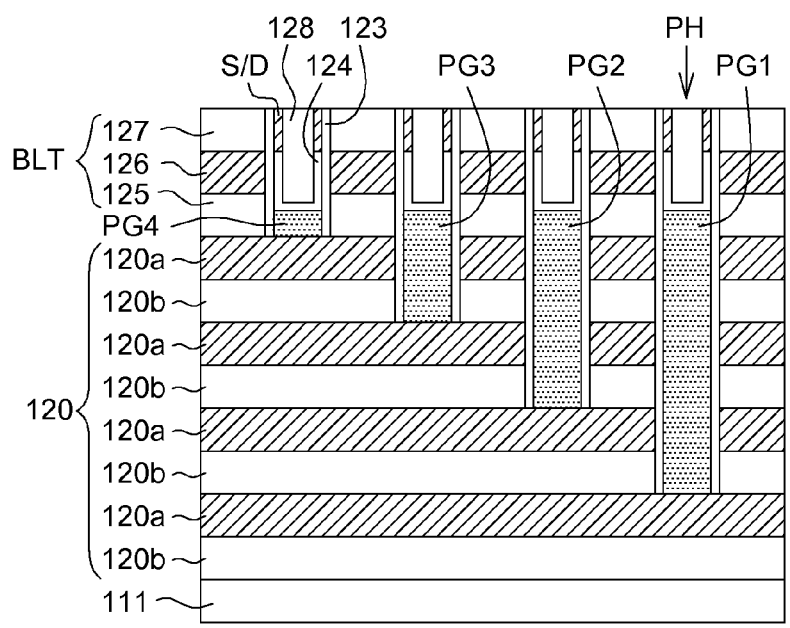
FIG. 2 shows a schematic cross-sectional view of a stair contact structure along an I-I line in FIG. 1.

Referring to FIG. 2, a schematic cross-sectional view of a stair contact structure along I-I line in FIG. 1 is shown. Taken a stair contact structure 120 with four layers of conductive planes 120a and four layers of insulating planes 120b formed on a substrate 111 for example, one of the bit lines BL1-BL4 is electrically connected to one of the conductive planes 120a via the conductive plugs PG1-PG4 formed on various conductive planes 120a, so that each of the bit lines BL1-BL4 has a capacitance composed of the capacitances between different conductive planes 120a. For example, the conductive planes 120a are polysilicon or metal. In addition, the insulating planes 120b are silicon oxide or silicon oxynitride. The conductive plugs PG1-PG4 are polysilicon or tungsten.

In an embodiment, the transistor structure BLT is formed on the top of the stair contact structure 120, which including a first insulating layer 125, a gate layer 126, a second insulating layer 127, a gate insulating layer 123 formed on the inner wall of a through hole PH and a semiconductor layer 124 isolated from the gate layer 126 by the gate insulating layer 123. Four through holes PH are shown in the FIG. 2. Each of the through holes PH penetrates the first insulating layer 125, the gate layer 126 and the second insulating layer 127. The semiconductor layer 124 is disposed into the through hole PH and the end of the semiconductor layer 124 adjacent to the second insulating layer 127 has a doped region S/D used as a source region or a drain region of the transistor structures BLT. The first insulating layer 125 and the second insulating layer 127 are silicon oxide or silicon oxynitride, for example. The gate layer 126 is doped polysilicon or metal, for example. The gate insulating layer 123 is silicon oxide, and the doped region S/D is n-type heavy doped region, whose depth is larger than that of the second insulating layer 127 to gain a bigger window.

As shown in FIG. 2, the semiconductor layer 124 is an undoped liner, which is covered by a third insulating layer 128 and formed in the through hole PH together, to lower the resistance of the semiconductor layer 124. Thus, the threshold voltage of the transistor is improved. The third insulating layer 128 is silicon oxynitride, for example. The depth of the third insulating layer 128 deposited in the through hole PH preferably is greater than or equal to the total depth of the gate layer 126 and the second insulating layer 127.

Figure 3:
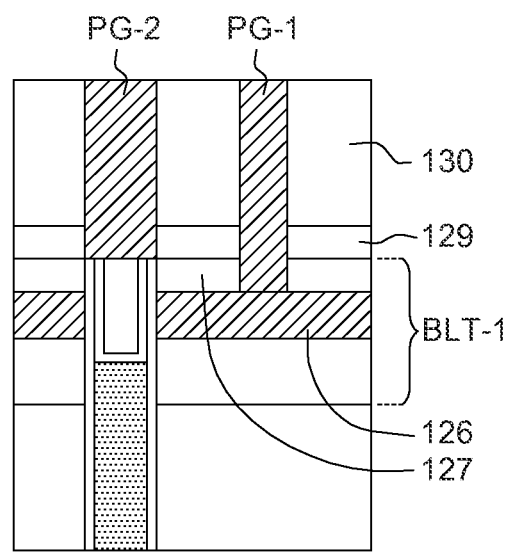
FIG. 3 shows a diagram illustrating a structure on the top of the transistor structure.

Referring to FIG. 3, the structure on the top of the transistor structure BLT-1 further includes a cap layer 129 and an inter-layer dielectric layer 130. The cap layer 129 selectively covers on the top of the second insulating layer 127, and the inter-layer dielectric layer 130 covers on the top of the cap layer 129. In addition, a conductive plug PG-1 penetrates through the inter-layer dielectric layer 130, the cap layer 129 and the second insulating layer 127 to be formed on the gate layer 126, so that the conductive line 131 or 132 formed on the inter-layer dielectric layer 130 can be connected to the gate layer 126 via the conductive plug PG-1 to control the voltage applied to the gate layer 126. In addition, a conductive plug PG-2 penetrates through the cap layer 129 and the inter-layer dielectric layer 130 to be formed on the transistor structure BLT-1, so that one of the bit lines BL1-BL4 can be connected to the transistor structure BLT-1 via the conductive plug PG-2.

In an embodiment, the transistor structures BLT are formed in a horizontal bulk area HB, i.e. the block annotated by dotted line in the FIG. 2, where the bit lines BL1-BL4 pass through and then connect to various conductive plans, and the current of the bit lines BL1-BL4 is controlled by the gate layer 126 around the horizontal bulk area HB, so that the forementioned metal-oxide-semiconductor (MOS) transistor structures can be used as switches for the bit lines BL1-BL4 to control the capacitances of the bit lines BL1-BL4.

Figure 4:
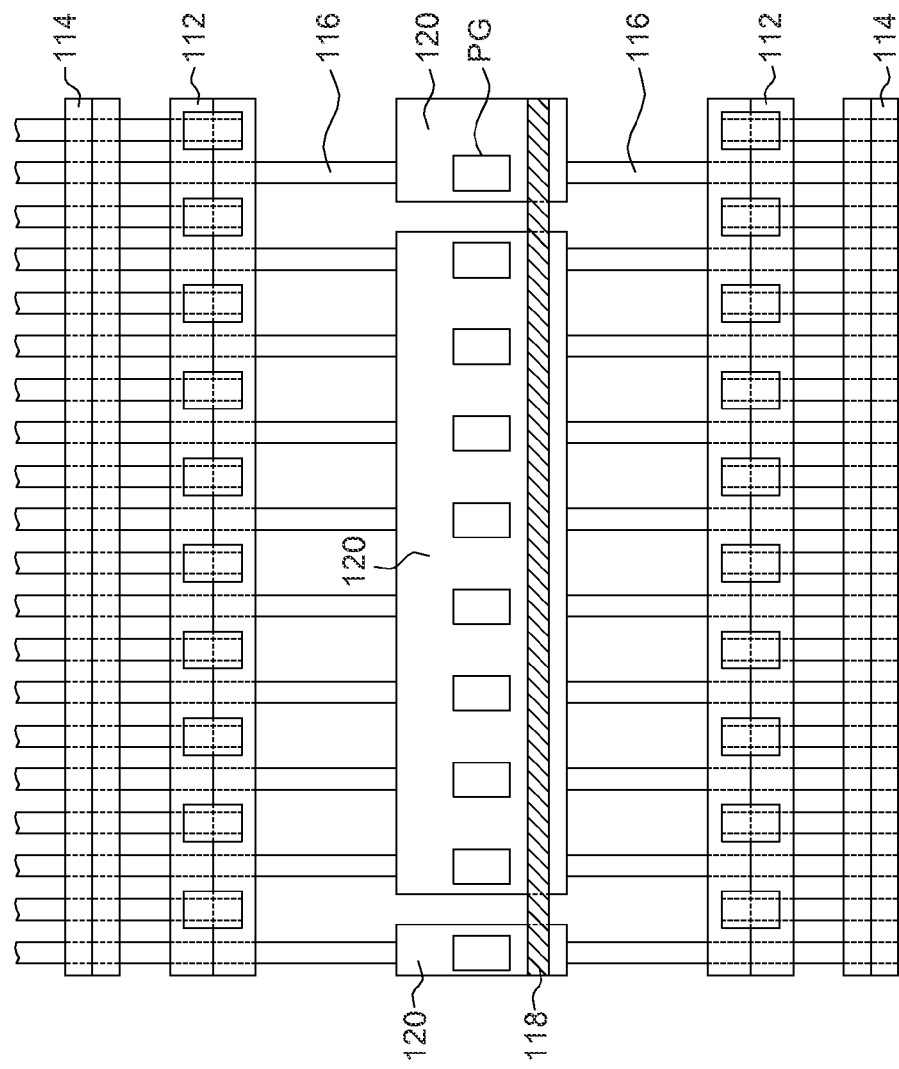
FIG. 4 further shows a disposition diagram of the stair contact structure.

Referring to FIG. 4, which further shows two SSL (serial selection line) gate structure 112, two source lines 114 and a plurality of conductive strips 116 disposed on two opposite sides of the stair contact structures 120. Each of the stair contact structures 120 is electrically connected to some of the conductive strips (for example, eight strips) through the conductive plugs PG formed on the conductive planes 120a in order, similar to the conductive plugs PG1-PG4 shown in the FIG. 2. In addition, the conductive line 118 is disposed across each of the stair contact structures 120, and the conductive line 118 can be connected to the gate layer 126 through the conductive plug PG-1 illustrated in the FIG. 3.

Figure 5A:
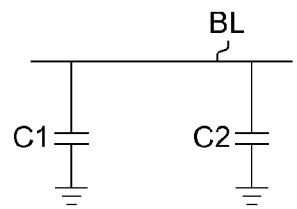
FIGS. 5A and 5B show two equivalent capacitance diagrams of bit lines in FIG. 1 without/with the transistor structures therein, respectively.
Figure 5B:
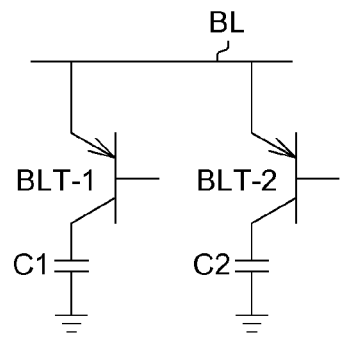
Figure 6A:
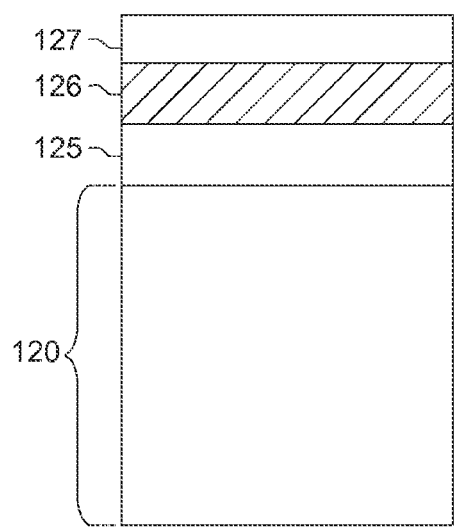
FIGS. 6A-6G further show a manufacturing method of a transistor structure illustrated in the FIG. 2.
Figure 6B:
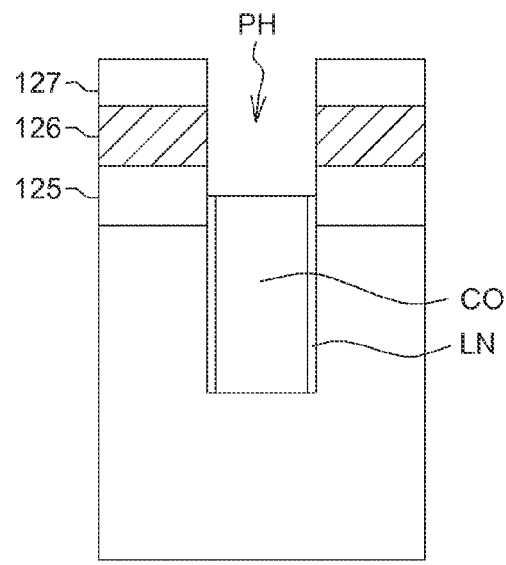
Figure 6C:
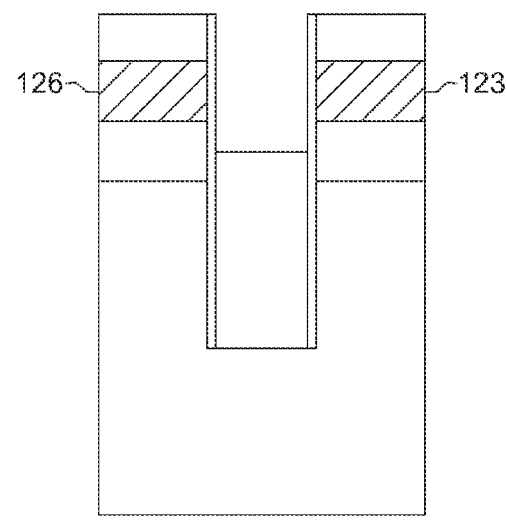
Figure 6D:
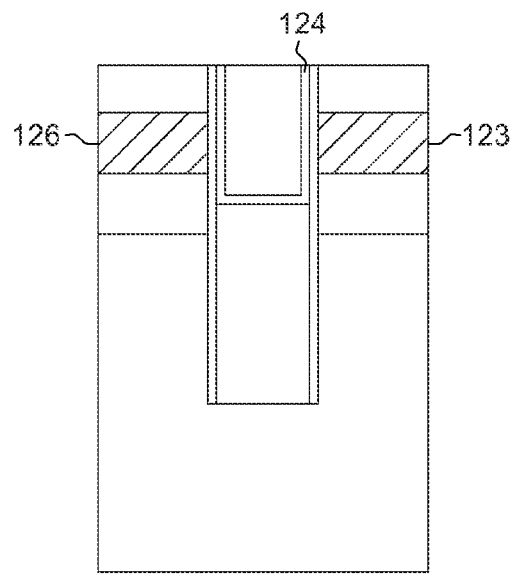
Figure 6E:
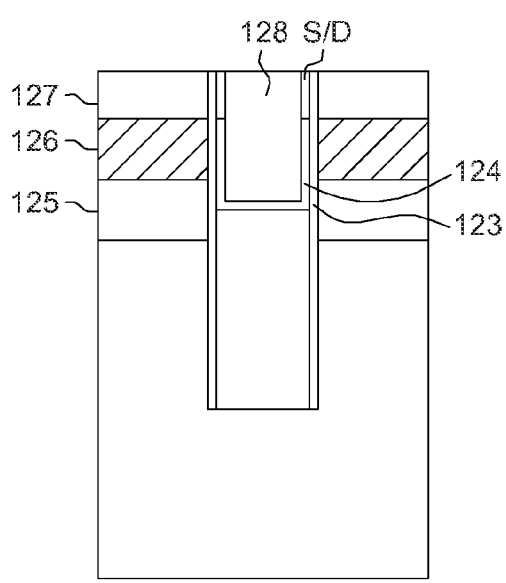
Figure 6F:
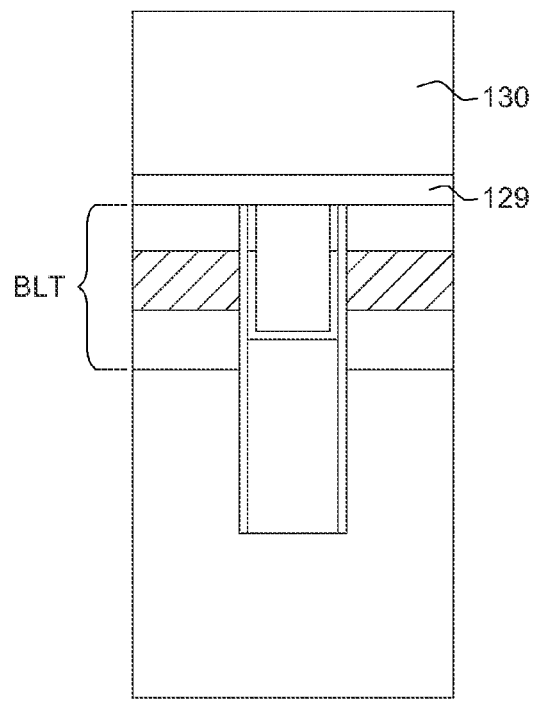
Figure 6G:
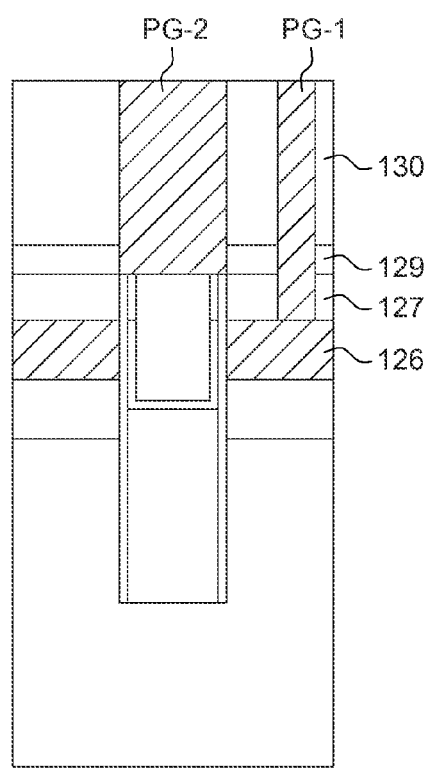

Referring to FIG. 5A and FIG. 5B, two equivalent capacitance diagrams of bit lines in FIG. 1 without/with the transistor structures therein are shown, respectively. As shown in FIG. 5A, since there are no transistor structures BLT-1 and BLT-2, the capacitance C of a bit line BL is equal to C1+C2, wherein the capacitance C1 is a combination of the capacitances between different conductive planes 120a in the first stair contact structure 121, and the capacitance C2 is a combination of the capacitances between different conductive planes 120a in the second stair contact structure 122. As shown in FIG. 5B, after the transistor structures BLT1, BLT2 are added, the capacitance C of the bit line BL can be controlled by the transistors being on or off. When the transistor structure BLT-1 is selected to open, the capacitance of the bit line BL is C1, while when the transistor structure BLT-2 is selected to open, the capacitance of the bit line BL is C2.

Therefore, the problem of a signal delay due to high capacitance of bit line is avoided by using the semiconductor structure of the present invention.

Referring to FIGS. 6A-6G, which further show a manufacturing method of a transistor structure illustrated in the FIG. 2. In the FIG. 6A, a first insulating layer 125, a gate layer 126 and a second insulating layer 127 are formed on the top of the stair contact structure 120 in sequence. In the FIG. 6B, a through hole PH is formed, and a liner layer LN and a conductor CO are formed in the through hole PH. In the FIG. 6C, a gate insulating layer 123 is formed on the inner wall of the through hole PH. In the FIG. 6D, a semiconductor layer 124 is formed in the through hole PH and the semiconductor layer 124 is electrically insulated from the gate layer 126 via the gate insulating layer 123. In the FIG. 6E, a doped region S/D is formed by ion implantation method on the end of the semiconductor layer 124 and adjacent to the second insulating layer 127. In addition, a third insulating layer 128 is further disposed into the through hole PH in the FIG. 6E, such that the transistor structure BLT is completely fabricated. In the FIG. 6F, a cap layer 129 is selectively formed on the second insulating layer 127 and then an inter-layer dielectric layer 130 is formed on the cap layer 129. In the FIG. 6G, a conductive plug PG-1 penetrating through the inter-layer dielectric layer 130, the cap layer 129 and the second insulating layer 127 is formed. A conductive plug PG-2 penetrating through the cap layer 129 and the inter-layer dielectric layer 130 is formed. The final structure is similar to that illustrated in the FIG. 3, and does not repeat again.

Second Embodiment

Figure 7:
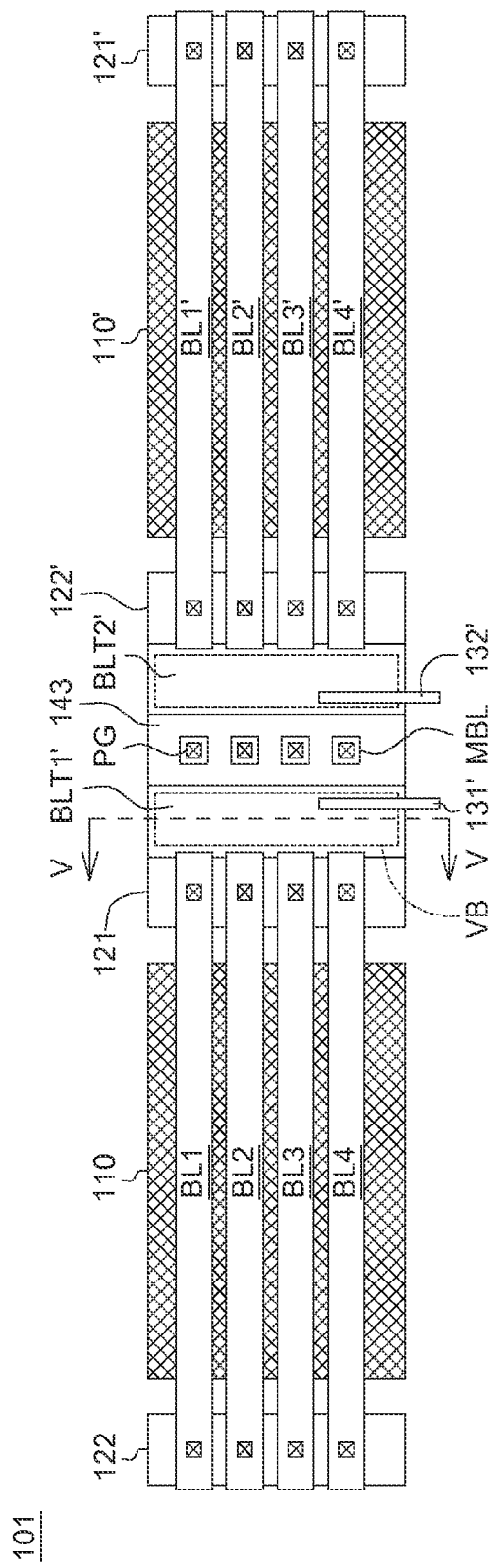
FIG. 7 shows a top schematic view of a semiconductor structure with improved capacitance of bit lines according to another embodiment of the invention.

Referring to FIG. 7, a top schematic view of a semiconductor structure 101 with improved capacitance of bit lines according to another embodiment of the invention is shown. In the above embodiment, a group of transistor structures BLT is formed on the top of the stair contact structure 120, while a group of transistor structures BLT1' (BLT2') formed on a side of the stair contact structure 121 (122') and a conductive line 131' (132') connected to the gate of the group of transistor structures BLT1' (BLT2') are disclosed in the present embodiment. The conductive line input a voltage to selectively open or close the transistor structures BLT1' (BLT2'). The details of description of the bit lines BL1-BL4 (BL1'-BL4'), the first stair contact structure s 121 (121'), the second stair contact structure s 122 (122') and the stacked memory structure 110 (110') are similar to the structures disclosed in the first embodiment, and do not repeat again.

Figure 8:
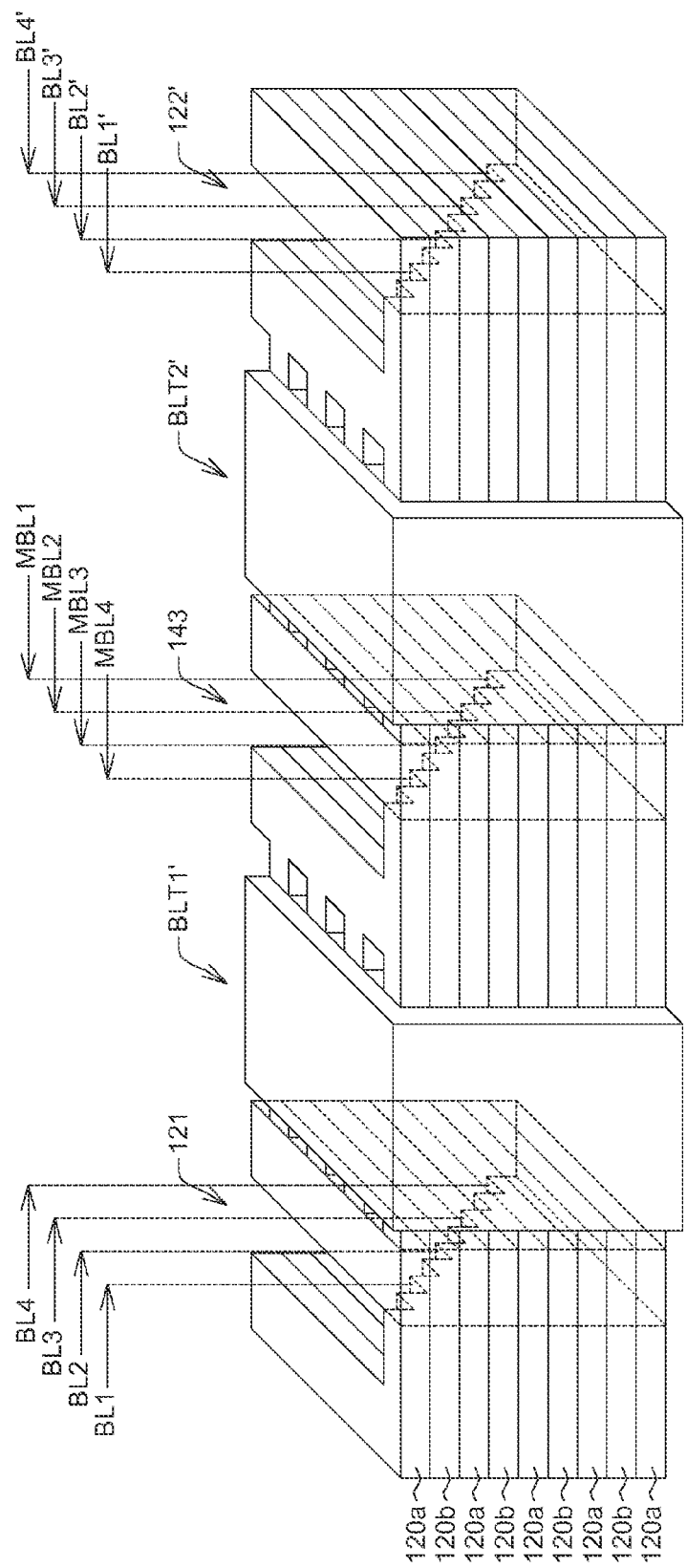
FIG. 8 further shows a three-dimension diagram of the stair contact structures and the transistor structures illustrated in the FIG. 7.

Referring to FIG. 8, the first stair contact structure has multi-layer conductive planes 120a and multi-layer insulating planes 120b interlaced to each other. In addition, the second stair contact structure 122' and the third stair contact structure 143 also have the same layers of conductive planes 120a and the insulating planes 120b with those of the first stair contact structure 121. The third stair contact structure 143 is disposed between the first group of transistor structures BLT1' and the second group of transistor structures BLT2'.

As shown in FIGS. 7 and 8, the first group of transistor structures BLT1' is connected to the first stacked memory structure 110 and the first local bit lines BL1-BL4 via the first stair contact structure 121, and the second group of transistor structures BLT2' is connected to the second stacked memory structure 110' and the second local bit lines BL1'-BL4' via the second stair contact structure 122'. In addition, four main bit lines MBL are connected to the first group of transistor structures BLT1' and the second group of transistor structures BLT2' via a number of conductive plugs PG' and the third stair contact structure 143, and the transistors are selected to open or close by a first conductive line 131' and a second conductive line 132' connected to the first group of transistor structures BLT1' and the second group of transistor structures BLT2', respectively.

Figure 9:
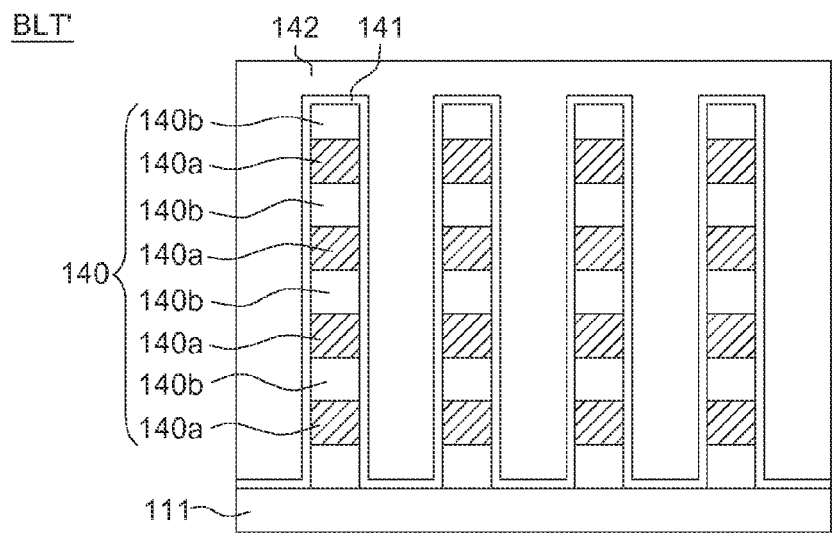
FIG. 9 shows a schematic cross-sectional view of the transistor structures along a V-V line in the FIG. 7.

Referring to FIG. 9, a schematic cross-sectional view of the transistor structures along a V-V line in the FIG. 7 is shown. Taken four stack structures 140 with four semiconductor layers 140a and four insulating layers 140b stacked alternately for example, the gate insulating layer 141 is formed around each of the stack structures 140, and the gate layer 142 is formed on the gate insulating layer 141 to form sixteen transistor structures controlled by the gate layer 142. As shown in the FIG. 7, when one of the bit lines BL1-BL4 is electrically connected to one of the conductive planes 120a by stairs via the conductive plugs PG1-PG4 formed on various conductive planes 120a, each of the conductive planes 120a then connects to the semiconductor layers 140a on the same layer of the transistor structures BLT' in the FIG. 9. For example, the insulating layer 140b is silicon oxide or silicon oxynitride, and the gate layer 142 is doped polysilicon or metal. The gate insulating layer 141 is silicon oxide, and the semiconductor layers 140a are undoped polysilicon layer, which forms a doped region by ion implantation to be a source region or a drain region of the transistor structures BLT'.

In an embodiment, the transistor structures BLT' are formed in a vertical bulk area VB, i.e. the block annotated by dotted line in the FIG. 7, where the main bit lines MBL pass through and then connect to various conductive plans, and the current of the mail bit lines MBL is controlled by the gate layer 142 around the vertical bulk area VB, so that the forementioned metal-oxide-semiconductor (MOS) transistor structures BLT' can be used as switches for the main bit lines MBL to control the capacitances of the main bit lines MBL.

Figure 10A:
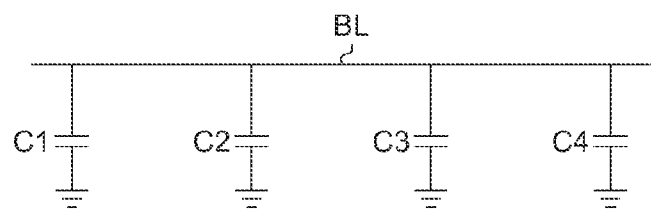
FIGS. 10A and 10B show an equivalent capacitance diagram of bit lines in the FIG. 7 without/with the transistor structures therein, respectively.
Figure 10B:
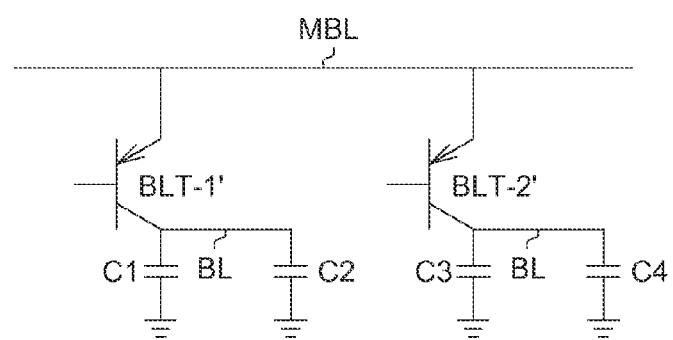

Referring to FIG. 10A and FIG. 10B, two equivalent capacitance diagrams of bit lines in FIG. 7 without/with the transistor structures therein are shown, respectively. As shown in FIG. 10A, since there are no transistor structures BLT-1' and BLT-2', the capacitance C of a bit line BL is equal to C1+C2+C3+C4, wherein the capacitances C1 and C2 are a combination of the capacitances between different conductive planes 120a in the first and second stair contact structures of the first stacked memory structure 110, and the capacitances C3 and C4 are a combination of the capacitances between different conductive planes 120a in the first and second stair contact structures of the second stacked memory structure 110'. As shown in FIG. 10B, after the transistor structures BLT-1', BLT-2' and a main bit line MBL are added, the capacitance C' of the main bit line MBL can be controlled by the transistors being on or off. When the transistor structure BLT-1' is selected to open, the capacitance C' of the main bit line MBL is C1+C2, while when the transistor structure is selected to open, the capacitance C' of the main bit line MBL is C3+C4. Therefore, the problem of a signal delay due to high capacitance of bit line is avoided by using the semiconductor structure of the present invention.

It will be apparent to those skilled in the art that various modifications and variations can be made to the disclosed embodiments. It is intended that the specification and examples be considered as exemplary only, with a true scope of the invention being indicated by the following claims and their equivalents.

What is claimed is:

1. A semiconductor structure with improved capacitance of bit lines, comprising:

a substrate;

a stacked memory structure formed on the substrate;

a plurality of bit lines crossing over the stacked memory structure;

a first stair contact structure formed on the substrate and comprising conductive planes and insulating planes stacked alternately, wherein the conductive planes are separated from each other by the insulating planes for connecting the bit lines to the stacked memory structure by stairs;

a first group of transistor structures formed in a first bulk area where the bit lines pass through and then connect to the conductive planes, the first group of transistor structures has a first gate around the first bulk area; and a first conductive line connected to the first gate to control a voltage applied to the first gate.

2. The semiconductor structure according to claim 1, wherein each of the transistor structures formed on the top of the first stair contact structure comprises a first insulating layer, a gate layer, a second insulating layer, a gate insulating layer formed on an inner wall of a through hole and a semiconductor layer isolated from the gate layer by the gate insulating layer, wherein the through hole penetrates the first insulating layer, the gate layer and the second insulating layer, the semiconductor layer is disposed into the through hole and an end of the semiconductor layer adjacent to the second insulating layer has a doped region used as a source region or a drain region of the transistor structures.

3. The semiconductor structure according to claim 2, further comprising a third insulating layer formed in the through hole and covering the semiconductor layer.

4. The semiconductor structure according to claim 3, wherein the third insulating layer comprises silicon oxynitride.

5. The semiconductor structure according to claim 2, further comprising a cap layer formed on the transistor structures and covering the second insulating layer.

6. The semiconductor structure according to claim 5, further comprising an inter-layer dielectric layer covering the cap layer.

7. The semiconductor structure according to claim 6, further comprising a conductive plug penetrating through the cap layer, the inter-layer dielectric layer and the second insulating layer to form on the gate layer.

8. The semiconductor structure according to claim 6, further comprising a conductive plug penetrating through the cap layer and the inter-layer dielectric layer to form on one of the transistor structures.

9. The semiconductor structure according to claim 2, wherein the gate insulating layer is silicon oxide, and the gate layer is doped polysilicon or metal.

10. The semiconductor structure according to claim 1, further comprising:

a second stair contact structure formed on the substrate for connecting the bit lines to the stacked memory structure by stairs;

a second group of transistor structures formed in a second bulk area where the bit lines pass through and then connect to the second stair contact structure, the second group of transistor structures has a second gate around the second bulk area; and a second conductive line connected to the second gate to control a voltage applied to the second gate.

11. A semiconductor structure with improved capacitance of bit lines, comprising:

a substrate;

a first stacked memory structure formed on the substrate;

a plurality of first local bit lines and main bit lines crossing over the first stacked memory structure;

a first stair contact structure formed on the substrate and comprising conductive planes and insulating planes stacked alternately, wherein the conductive planes are separated from each other by the insulating planes for connecting the first local bit lines to the first stacked memory structures by stairs;

a first group of transistor structures formed in a first bulk area where the main bit lines pass through and then connect to the conductive planes, the first group of transistor structures has a first gate around the first bulk area; and a first conductive line connected to the first gate to control a voltage applied to the first gate.

12. The semiconductor structure according to claim 11, wherein the first group of transistor structures comprises a stack structure with semiconductor layers and insulating layers stacked alternately, a gate insulating layer and a gate layer, the gate insulating layer is formed around the stack structure, and the gate layer is formed on the gate insulating layer, the semiconductor layers have a doped region to be a source region or a drain region of the transistor structures.

13. The semiconductor structure according to claim 12, wherein the gate insulating layer is silicon oxide, and the gate layer is doped polysilicon or metal.

14. The semiconductor structure according to claim 11, further comprising:

a second stair contact structure formed on the substrate for connecting second local bit lines to a second stacked memory structure by stairs;

a second group of transistor structures formed in a second bulk area where the main bit lines pass through and then connect to the second stair contact structure, the second group of transistor structures has a second gate around the second bulk area; and a second conductive line connected to the second gate to control a voltage applied to the second gate.

15. The semiconductor structure according to claim 14, further comprising a third stair contact structure between the first group of transistor structures and the second group of transistor structures for connecting the main bit lines to the first group of transistor structures and the second group of transistor structures by stairs.

* * * * *